United States Patent
Su et al.

(10) Patent No.: US 11,979,971 B2
(45) Date of Patent: May 7, 2024

(54) EUV LIGHT SOURCE AND APPARATUS FOR LITHOGRAPHY

(71) Applicant: TAIWAN SEMICONDUCTOR MANUFACTURING CO., LTD., Hsinchu (TW)

(72) Inventors: Yen-Shuo Su, Hsinchu (TW); Chun-Lin Chang, Zhubei (TW); Han-Lung Chang, Kaohsiung (TW); Li-Jui Chen, Hsinchu (TW); Po-Chung Cheng, Zhongpu Shiang (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/380,423

(22) Filed: Apr. 10, 2019

(65) Prior Publication Data
US 2020/0008290 A1   Jan. 2, 2020

Related U.S. Application Data

(60) Provisional application No. 62/692,211, filed on Jun. 29, 2018.

(51) Int. Cl.
*H05G 2/00* (2006.01)
*G03F 7/00* (2006.01)
(Continued)

(52) U.S. Cl.
CPC ......... *H05G 2/005* (2013.01); *G03F 7/70033* (2013.01); *G03F 7/70175* (2013.01);
(Continued)

(58) Field of Classification Search
CPC .......... H05G 2/005; H05G 2/00; H05G 2/008; G03F 7/70033; G03F 7/70175; G03F 7/70916; G03F 7/2004; G21K 1/06
See application file for complete search history.

(56) References Cited

U.S. PATENT DOCUMENTS 7,060,993 B2 * 6/2006 Wedowski .......... G03F 7/70916
                                                      250/306
8,796,666 B1     8/2014 Huang et al.
(Continued)

FOREIGN PATENT DOCUMENTS

KR   20090026170 A  *  3/2009  ............... B08B 7/00
KR   20170003345 A  *  1/2017  ......... H01L 29/7834
(Continued)

OTHER PUBLICATIONS

Shin et al., "Plasma Sn cleaning integrated in EUV source system" (Year: 2008).*
(Continued)

*Primary Examiner* — Michael J Logie
(74) *Attorney, Agent, or Firm* — STUDEBAKER & BRACKETT PC

(57) ABSTRACT

An extreme ultra violet (EUV) radiation source apparatus includes a collector mirror, a target droplet generator for generating a tin (Sn) droplet, a rotatable debris collection device, one or more coils for generating an inductively coupled plasma (ICP), a gas inlet for providing a source gas for the ICP, and a chamber enclosing at least the collector mirror and the rotatable debris collection device. The gas inlet and the one or more coils are configured such that the ICP is spaced apart from the collector mirror.

15 Claims, 5 Drawing Sheets

(51) Int. Cl.
*G03F 7/20* (2006.01)
*G21K 1/06* (2006.01)

(52) U.S. Cl.
CPC ........... *G03F 7/70916* (2013.01); *G21K 1/06* (2013.01); *H05G 2/00* (2013.01); *H05G 2/008* (2013.01)

(56) References Cited

U.S. PATENT DOCUMENTS

| | | |
|---|---|---|
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 10,295,916 B2* | 5/2019 | Mulder ............... G03F 7/70033 |
| 2007/0062557 A1* | 3/2007 | Rakhimova ......... G03F 7/70925 134/1.1 |
| 2007/0069162 A1* | 3/2007 | Banine ................ G03F 7/70916 250/504 R |
| 2007/0187627 A1 | 8/2007 | Ershov et al. |
| 2008/0073571 A1* | 3/2008 | Imoto .................. G03F 7/70808 250/492.1 |
| 2009/0001288 A1* | 1/2009 | Buis ................... G03F 7/70916 250/492.2 |
| 2009/0154642 A1* | 6/2009 | Bykanov ............. G03F 7/70841 378/34 |
| 2010/0051827 A1* | 3/2010 | Derra .................. G03F 7/70166 250/492.1 |
| 2011/0048452 A1* | 3/2011 | Zink ...................... B82Y 10/00 134/1 |
| 2012/0000490 A1* | 1/2012 | Chung ................ C23C 16/4405 134/22.12 |
| 2012/0223256 A1* | 9/2012 | Bykanov ................ H05G 2/008 250/504 R |
| 2013/0106286 A1* | 5/2013 | Banna ...................... H05H 1/46 315/111.21 |
| 2016/0209753 A1* | 7/2016 | Zhao ................... G03F 7/70916 |
| 2016/0252821 A1* | 9/2016 | De Jong ............. G03F 7/70175 355/71 |
| 2017/0215265 A1* | 7/2017 | Baek ...................... H05G 2/008 |

FOREIGN PATENT DOCUMENTS

| | | | | |
|---|---|---|---|---|
| KR | 20170066218 A | * | 6/2017 | .............. C23C 16/56 |
| WO | WO-2004104707 A2 | * | 12/2004 | ............... B08B 7/00 |
| WO | WO-2014121873 A1 | * | 8/2014 | ......... G03F 7/70925 |

OTHER PUBLICATIONS

Shin et al., "Halide etching for tin EUV optics cleaning" (Year: 2007).*

Carbon Tetrachloride, PubChem National library of Medicine retrieved from https://pubchem.ncbi.nlm.nih.gov/compound/5943 (Year: 2023).*

* cited by examiner

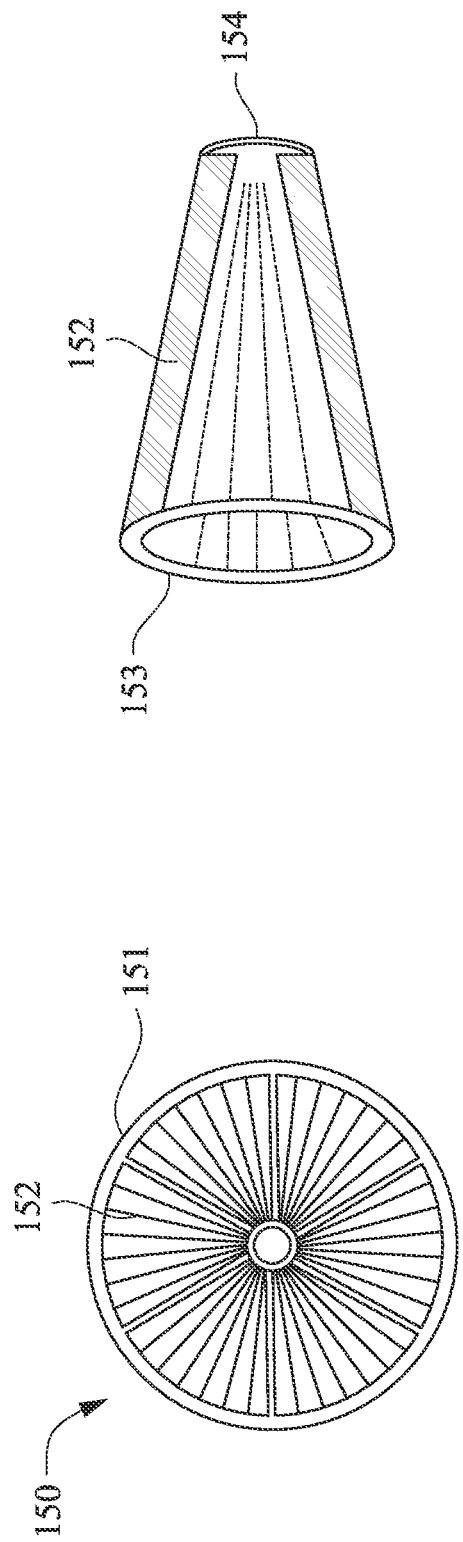
FIG. 2A
FIG. 2B
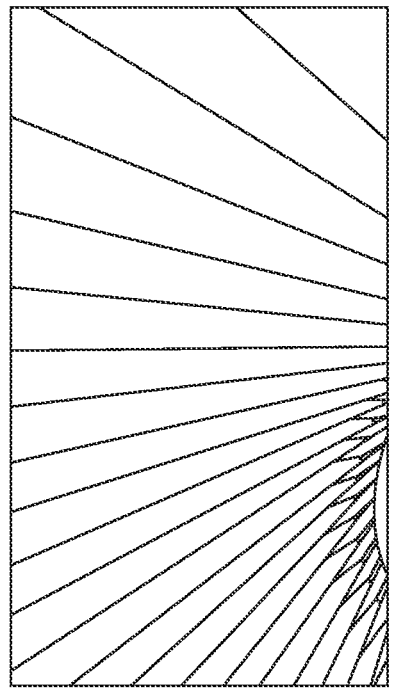
FIG. 2C

EUV LIGHT SOURCE AND APPARATUS FOR LITHOGRAPHY

RELATED APPLICATION

This application claims priority of U.S. Provisional Patent Application No. 62/692,211 filed on Jun. 29, 2018, the entire content of which is incorporated herein by reference.

BACKGROUND

This disclosure relates to pattern forming methods used in semiconductor manufacturing processes, and an apparatus for lithography.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP collector mirror and reflected by optics towards a lithography target, e.g., a wafer. The LPP collector mirror is subjected to damage and degradation due to the impact of particles, ions, radiation, and most seriously, tin deposition.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a schematic front view of a debris collection mechanism used in the EUV radiation source according to some embodiments of the present disclosure. FIG. 2B is a schematic side view of a debris collection mechanism used in the EUV radiation source according to some embodiments of the present disclosure. FIG. 2C is a partial picture of a vane used in the EUV radiation source according to some embodiments of the present disclosure.

DETAILED DESCRIPTION

Figure 1:
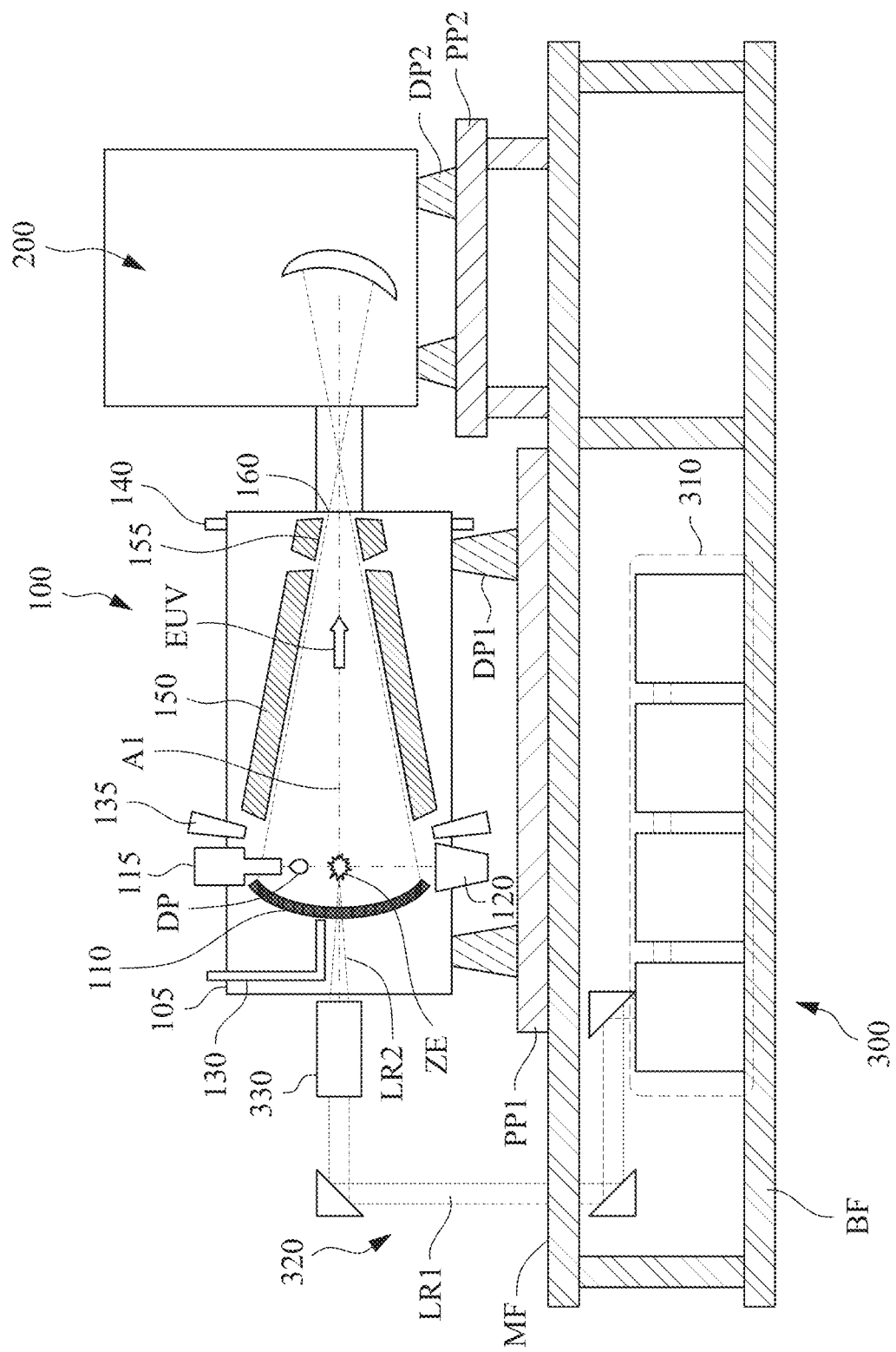
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to apparatus and methods for mitigating contamination on a collector mirror in a laser produced plasma (LPP) EUV radiation source. The collector mirror, also referred to as an LPP collector mirror or an EUV collector mirror, is an important component of the LPP EUV radiation source. It collects and reflects EUV radiation and contributes to overall EUV conversion efficiency. However, it is subjected to damage and degradation due to the impact of particles, ions, radiation, and debris deposition. In particular, tin (Sn) debris is one of the contamination sources of the EUV collector mirror. EUV collector mirror life time, the duration of time in which the reflectivity decays to half of itself, is one of the most important factors for an EUV scanner. The major reason for decay of the collector mirror is the residual metal contamination (tin debris) on the collector mirror surface caused inevitably by the EUV light generation procedure.

One of the objectives of the present disclosure is directed to reducing debris deposition onto the LPP collector mirror thereby increasing its usable lifetime. More specifically, this disclosure is directed to self-destroying a metallic coating and accumulation on the EUV collector mirror by plasma cleaning using Cl radicals. The technology of this disclosure keeps the collector mirror in a desirable status for a longer period of time thereby reducing the frequency of swapping the collector mirror. In other words, an EUV scanner will maintain the highest exposure power and throughput, and require less frequent maintenance, thereby reducing the week-long down time required to swap the collector mirror.

FIG. 1 is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image onto the resist.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP collector mirror 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per millisecond (50 kHz) and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation laser includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector mirror 110 further reflects and focuses the EUV radiation for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The collector mirror 110 is designed with a proper coating material and shape to function as a mirror for EUV collection, reflection, and focusing. In some embodiments, the collector mirror 110 is designed to have an ellipsoidal geometry. In some embodiments, the coating material of the collector mirror 110 is similar to the reflective multilayer of the EUV mask. In some examples, the coating material of the collector mirror 110 includes a ML (such as a plurality of Mo/Si film pairs) and may further include a capping layer (such as Ru) coated on the ML to substantially reflect the EUV light. In some embodiments, the collector mirror 110 may further include a grating structure designed to effectively scatter the laser beam directed onto the collector mirror 110. For example, a silicon nitride layer is coated on the collector mirror 110 and is patterned to have a grating pattern.

In such an EUV radiation source apparatus, the plasma caused by the laser application creates physical debris, such as ions, gases and atoms of the droplet, as well as the desired EUV radiation. It is necessary to prevent the accumulation of material on the collector mirror 110 and also to prevent physical debris exiting the chamber 105 and entering the exposure tool 200.

As shown in FIG. 1, in the present embodiments, a buffer gas is supplied from a first buffer gas supply 130 through the aperture in collector mirror 110 by which the pulse laser is delivered to the tin droplets. In some embodiments, the buffer gas is $H_2$, He, Ar, N or another inert gas. In certain embodiments, $H_2$ is used as H radicals generated by ionization of the buffer gas can be used for cleaning purposes. The buffer gas can also be provided through one or more second buffer gas supplies 135 toward the collector mirror 110 and/or around the edges of the collector mirror 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector mirror 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms (DCM) 150 are employed in the chamber 105.

As shown in FIG. 1, one or more DCMs 150 are disposed along optical axis A1 between the zone of excitation ZE and an output port 160 of the EUV radiation source 100. FIG. 2A is a front view of the DCM 150 and FIG. 2B is a schematic side view of DCM 150. FIG. 2C is a partial picture of the DCM 150. The DCM 150 includes a frustoconical support frame 151, a first end support 153 and a second end support 154 that operably support a plurality of vanes 152 (rotatable debris collection device) that rotate within the housings. The first end support 153 has a larger diameter than the second end support 154. The DCM 150 serves to prevent the surface of collector mirror 110 and/or other elements/portions of the inside the chamber 105 from being coated by Sn vapor by sweeping out slow Sn atoms and/or $SnH_4$ via rotating vanes 152. In some embodiments, a lower cone 155 is disposed between the DCMs 150 and the output port 160.

The plurality of vanes 152 project radially inwardly from the frustoconical support frame 151. The vanes 152 are thin and elongate plates. In some embodiments, each of the vanes has a triangular or trapezoid or trapezium shape in plan view. The vanes 152 are aligned so that their longitudinal axes are parallel to the optical axis A1 so that they present the smallest possible cross-sectional area to the EUV radiation EUV. The vanes 152 project towards the optical axis A1, but do not extend as far as the optical axis. In some embodiments, a central core of the DCM 150 is empty. The DCM 150 is rotated by a drive unit including one or more motors, one or more belts and/or one or more gears, or any rotating mechanism. The vanes 152 are heated at 100° C. to 400° C. by a heater in some embodiments.

As set forth above, contamination of tin debris on the collector mirror, vanes and/or other parts of the EUV radiation source is the major cause of the EUV scanner exposure power loss and throughput down trend. The collector mirror life time is maintained at about 3 months, for example, and then it is generally necessary to take a week or more down time to swap the collector mirror with a new collector mirror to maintain high exposure power and throughput.

In some configurations, hydrogen radicals created by EUV exposure are used to etch tin debris by forming $SnH_4$. However, $SnH_4$ is thermodynamically unstable and causes re-deposition of tin on the collector mirror or other part of the EUV radiation source. Further, the production of hydrogen radicals affects the creation of EUV accompanied by more tin debris.

In the present embodiments, the metal contamination is removed by using inductively coupled plasma (ICP) to produce halogen radicals, such as Cl radicals, to remove tin debris and/or to prevent tin debris from depositing on the collector mirror or other parts of the EUV radiation source. In some embodiments, a gas injection with a tunable gas flow and gas type for different types of radical/ion production is employed. In some embodiments, a halogen containing gas is utilized. In certain embodiments, a Cl containing gas is used to generate Cl radicals/ions that remove the tin by etching through the formation of $SnCl_4$. The Cl containing gas can be $Cl_2$, $CH_xCl_y$ (x+y=4, y is not zero), $SiCl_4$ or $SiH_2Cl_2$. One or more carrier gases including Ar, He, Xe and/or $H_2$ are also supplied in some embodiments. In addition, in some embodiments, the plasma position distribution is tunable to control the tin etching spatial distribution. In some embodiments, multiple circuits for ICP sources are used to tune the current ratio between different circuits and to change the plasma distribution, which dominates the spatial etching rate. In some embodiments, the source gas for the ICP plasma includes one or more of He, Ar, Xe, $Cl_2$, $H_2$, $O_2$, $SiH_4$ and $SiCl_4$.

In other embodiments, silicon containing gas and/or zirconium containing gas is/are used to form a passivation coating layer of $ZrO_2$ and/or $SiO_2$ on parts inside the laser chamber. In some embodiments, zirconium tetra-tert-butoxide ($Zr(OC(CH_3)_3)_4$) is used for a Zr source gas, and $SiH_4$ is used for a Si source gas. An oxygen source gas can be $O_2$. One or more carrier gases including Ar, He, Xe and/or $H_2$ are also supplied in some embodiments.

Figure 3:
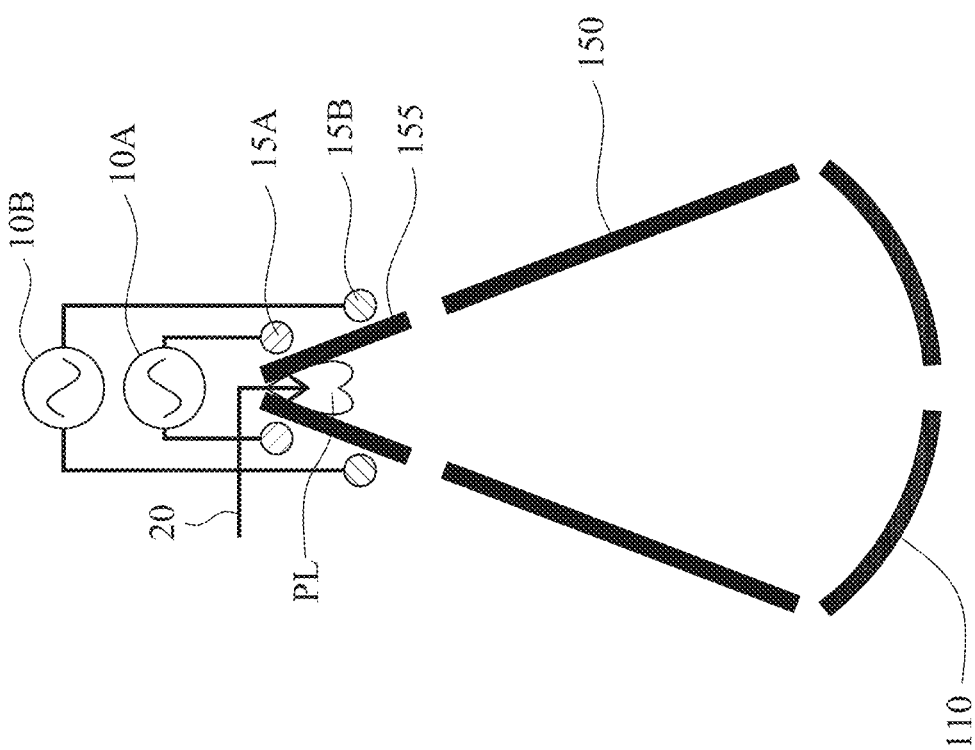
FIG. 3 shows a schematic view of an EUV radiation source according to an embodiment of the present disclosure.

FIG. 3 shows a schematic view of a vacuum chamber of an EUV radiation source according to an embodiment of the present disclosure. As shown in FIG. 3, one or more additional inductively coupled plasma circuits are provided on or around the vessel boundary at the lower cone 155 to create plasma PL. In this configuration, since the plasma PL is generated at a location far from the collector mirror 110, it is possible to prevent damage to the collector mirror by the plasma PL. In some embodiments, the plasma PL does not directly etch the tin debris deposited on the collector mirror 110. In some embodiments, a Cl containing gas is introduced from a gas inlet 20. The source gas is introduced from a location near the EUV outlet port 160 (see, FIG. 1). By controlling gas flow amounts of one or more source gases by one or more flow controllers, it is possible to control the location of the generated plasma PL. In some embodiments, the plasma PL touches the lower cone 155, and in other embodiments, the plasma PL does not touch the lower cone 155.

In some embodiments, two RF power sources 10A and 10B are provided, which provide AC power (AC current) to coils 15A and 15B, respectively. The RF power sources 10A and 10B can independently control current/power for the coils 15A and 15B. In some embodiments, the phases of AC currents supplied by two RF power sources 10A and 10B are 180 degrees different from each other. By controlling current values and/or phases of one or more RF power sources, it is possible to control the location of the generated plasma PL. In other embodiments, the phases of the AC current are same. In certain embodiments, only one RF power source is provided, and in other embodiments, three or more RF power sources, with different current phases or with the same phase, are provided. The frequency of the RF power source is 13.56 MHz in some embodiments, and is 2.45 GHz in other embodiments.

Figure 4:
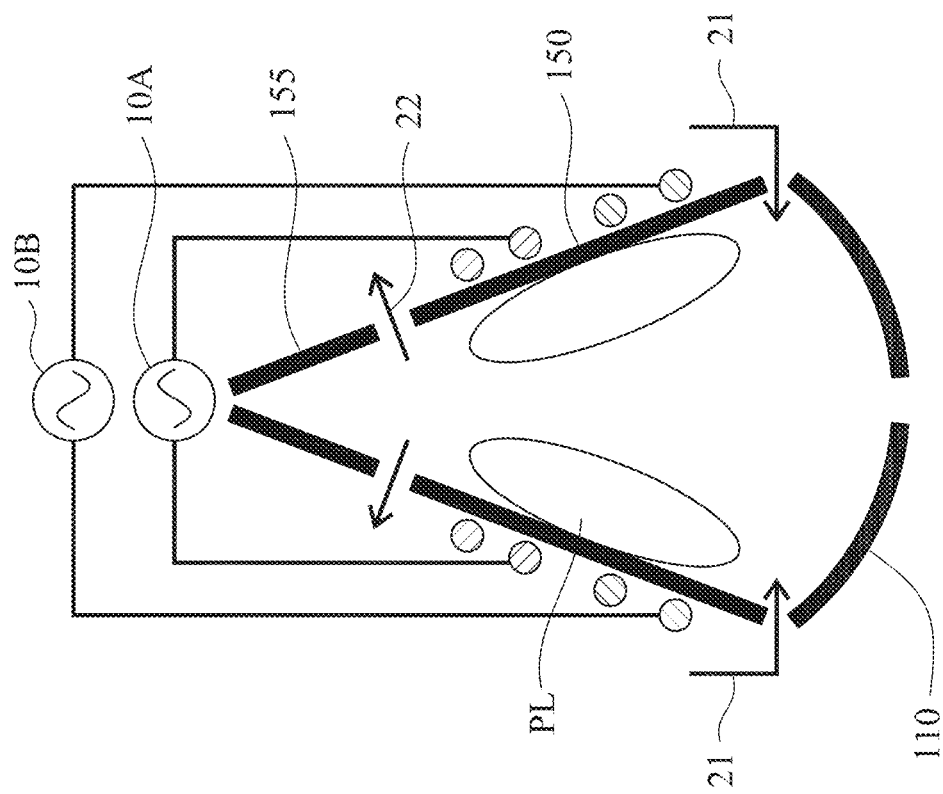
FIG. 4 shows a schematic view of an EUV radiation source according to an embodiment of the present disclosure.

FIG. 4 shows a schematic view of a chamber of an EUV radiation source according to another embodiment of the present disclosure. As shown in FIG. 4, one or more inductively coupled plasma circuits are provided on or around the vessel boundary at the vane 150 to create plasma PL. In this configuration, since the plasma PL is generated at a location far from the collector mirror 110, it is possible to prevent damage to the collector mirror by the plasma PL. In some embodiments, a Cl containing gas is introduced from a gas inlet 21. The source gas is introduced from a location between the vane 150 and the collector mirror 110 and exhausted from a location (gas outlet 22) between the vane 150 and the lower cone 155 and/or a location near the EUV outlet port 160. Accordingly, the plasma PL generated with the source gas flows from the collector mirror side to the lower cone side, and thus it is possible to prevent damage to the collector mirror 110 by the plasma PL. By controlling gas flow amounts of one or more source gases by one or more flow controllers, it is possible to control the location of the generated plasma PL. In some embodiments, the plasma PL touches the vanes 150, and in other embodiments, the plasma PL does not touch the vanes 150.

In some embodiments, two RF power sources 10A and 10B are provided, which provide AC power (AC current) to coils 15A and 15B, respectively. In some embodiments, the phases of AC currents supplied by two RF power sources 10A and 10B are 180 degrees different from each other. By controlling current values and/or phases of one or more RF power sources, it is possible to control the location of the generated plasma PL. In other embodiments, the phases of the AC current are same. In certain embodiments, only one RF power source is provided, and in other embodiments, three or more RF power sources, with different current phases or with the same phase, are provided.

Figure 5:
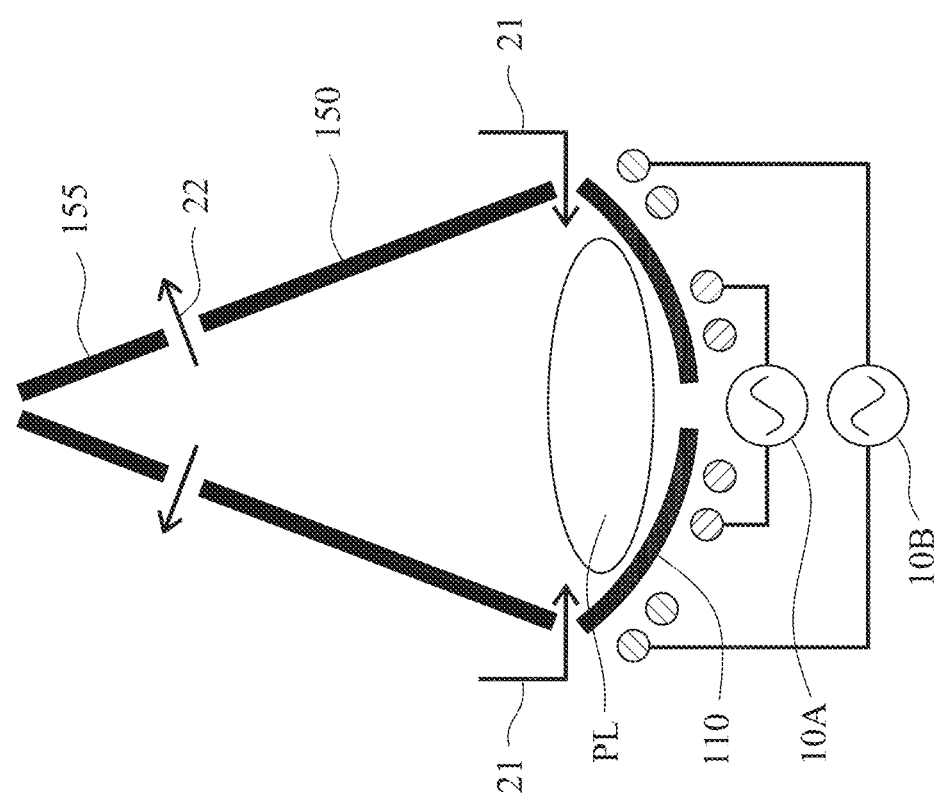
FIG. 5 shows a schematic view of an EUV radiation source according to an embodiment of the present disclosure.

FIG. 5 shows a schematic view of a chamber of an EUV radiation source according to another embodiment of the present disclosure. As shown in FIG. 5, one or more inductively coupled plasma circuits are provided on or around the collector mirror 110 to create plasma PL. In this configuration, the plasma PL generation is controlled such that the plasma PL is generated at a location sufficiently far from the collector mirror 110 to prevent damage to the collector mirror by the plasma PL. In some embodiments, the plasma PL (light emitting portion) does not touch the collector mirror 110. In other embodiments, since radicals are alive even after they travel out of the plasma PL, a longer distance than the dimension of the plasma emission area is set between the plasma PL and the collector mirror 110.

In some embodiments, a Cl containing gas is introduced from a gas inlet 21. The source gas is introduced from a location between the vane 150 and the collector mirror 110 and exhausted from a location (gas outlet 22) between the vane 150 and the lower cone 155 and/or a location near the EUV outlet port 160. Accordingly, the plasma PL generated with the source gas flows from the collector mirror side to the lower cone side, and thus it is possible to prevent damage to the collector mirror 110 by the plasma PL. By controlling gas flow amounts of one or more source gases by one or more flow controllers, it is possible to control the location of the generated plasma PL. In some embodiments, the plasma PL touches the vanes 150, and in other embodiments, the plasma PL does not touch the vanes 150.

In some embodiments, two RF power sources 10A and 10B are provided, which provide AC power (AC current) to coils 15A and 15B, respectively. In some embodiments, the phases of AC currents supplied by two RF power sources 10A and 10B are 180 degrees different from each other. By controlling current values and/or phases of one or more RF power sources, it is possible to control the location of the generated plasma PL. In other embodiments, the phases of the AC current are same. In certain embodiments, only one RF power source is provided, and in other embodiments, three or more RF power sources, with different current phases or with the same phase, are provided.

Figure 6:
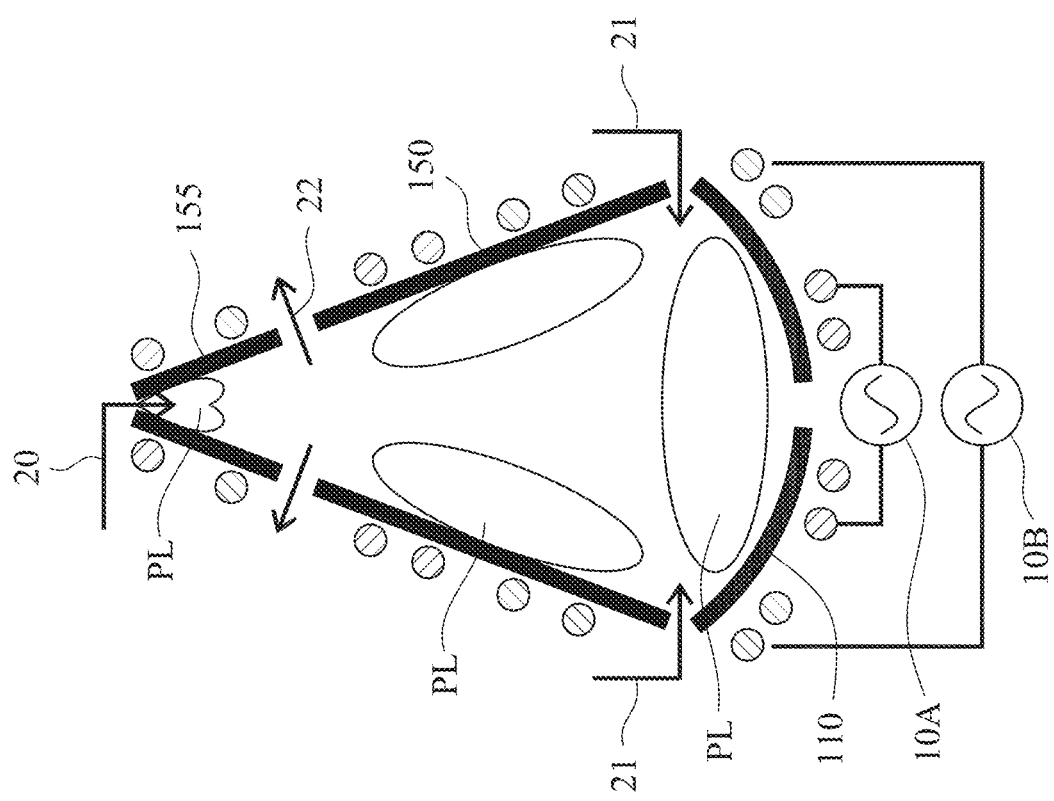
FIG. 6 shows a schematic view of an EUV radiation source according to an embodiment of the present disclosure.
Figure 7:
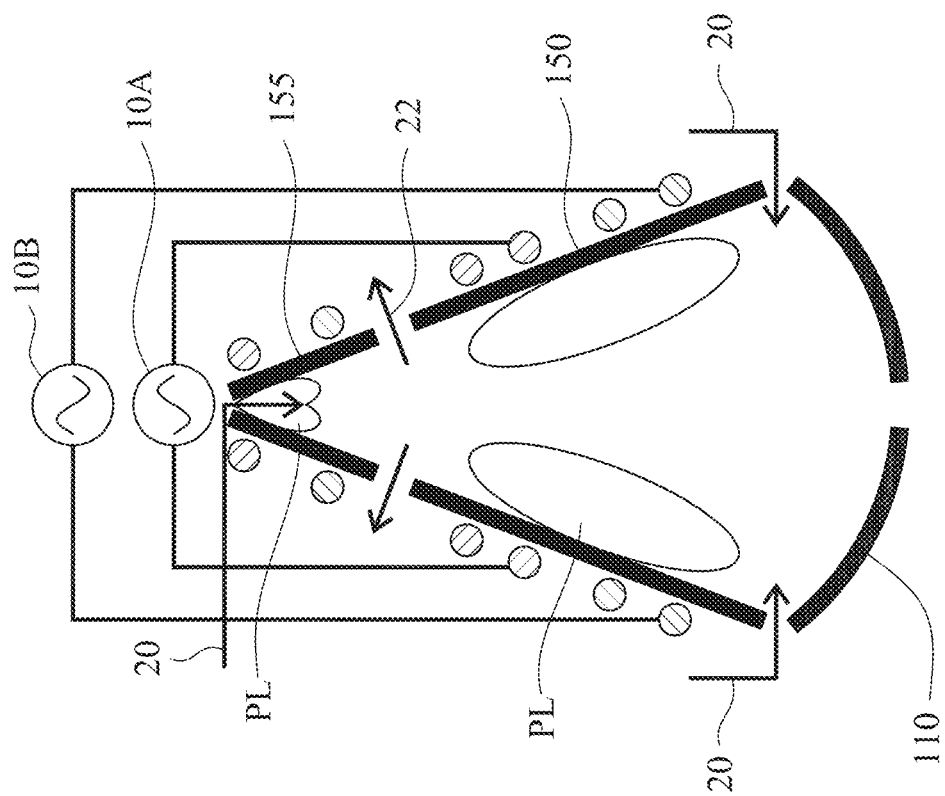
FIG. 7 shows a schematic view of an EUV radiation source according to an embodiment of the present disclosure.

FIGS. 6 and 7 show schematic views of a chamber of an EUV radiation source according to other embodiments of the present disclosure. The configuration of FIG. 6 is the combination of three of the configurations explained with respect to FIGS. 3-5. In some embodiments, two of the configurations of FIGS. 3-5 are combined. In one embodiment, the configurations of FIGS. 3 and 4 are combined, as shown in FIG. 7. By tuning the relative signal strength of the RF power sources, phases and/or gas flow amounts, it is possible to adjust the location of the plasma (strongest position of the plasma). When the configurations of FIGS. 3-5 are combined, two RF power sources 10A and 10B are utilized for coils 15A and 15B shown in FIGS. 3-5 in some embodiments, and in other embodiments, respective RF power sources 10A and 10B are utilized for respective coils 15A and 15B shown in FIGS. 3-5. In some embodiments, when pressure is below about $1.0 \times 10^{-6}$ Torr, a tin etching rate by the Cl plasma is more than about 600 nm/min.

In the foregoing embodiments, the plasma PL is generated to remove tin debris. In other embodiments, a passivation layer is formed on various parts inside a vacuum chamber of an EUV radiation source. For example, by using a Zr containing gas and/or a Si containing gas, it is possible to deposit $ZrO_2$ and/or $SiO_2$ passivation layer on the various parts inside the vacuum chamber, such as a collector mirror and/or vanes.

In an exposure mode, in which EUV light is generated by laser pulses, $SnH_4$ is generated by the reaction between Sn and hydrogen or hydrogen radicals. When a Cl containing gas is introduced and plasma including Cl radicals is generated in the exposure mode, $SnCl_4$ is also generated. By exhausting $SnH_4$ and $SnCl_4$ from the chamber, it is possible to reduce generation of tin debris inside the chamber. Since the thermal decomposition temperature of $SnCl_4$ is higher than 1250K, $SnCl_4$ is much more stable than $SnH_4$ (decomposition temperature between 300K-500K). Accordingly, by increasing an amount of $SnCl_4$, it is possible to prevent re-deposition of tin on the parts inside the chamber.

In an idle mode, in which no EUV light is generated (and thus no tin byproduct is generated), by generating plasma including Cl radicals, tin debris or tin byproducts deposited on the parts inside the chamber are cleaned by forming $SnCl_4$. By exhausting $SnH_4$ and $SnCl_4$ from the chamber, it is possible to reduce generation of tin debris inside the chamber.

In other embodiments, in the idle mode, after the plasma to remove the tin debris is generated and the tin debris is removed, the source gas is changed from a Cl containing gas to a Zr containing gas and/or a Si containing gas. Thus, a passivation layer made of $ZrO_2$ and/or $SiO_2$ is formed over cleaned surfaces of the parts inside the vacuum chamber of an EUV radiation source. In some embodiments, deposition of the passivation layer and etching by plasma are repeated.

In the embodiments of the present disclosure, an ICP plasma generated using a Cl containing gas is employed to remove tin debris caused during EUV light generation. Since $SnCl_4$ has a higher decomposition temperature than $SnH_4$, it is possible to more effectively remove the tin debris from a vacuum chamber of an EUV radiation source. In other embodiments, by using a Zr containing gas and/or a Si containing gas, a passivation layer can be formed on parts inside the vacuum chamber of the EUV radiation source to prevent deposition of tin debris and/or to remove deposited tin debris more easily. Accordingly, it is possible to extend a life of a collector mirror and to reduce frequency of exchanging a used collector mirror with a new, clean collector mirror.

It will be understood that not all advantages have been necessarily discussed herein, no particular advantage is required for all embodiments or examples, and other embodiments or examples may offer different advantages.

In accordance with one aspect of the present disclosure, an extreme ultra violet (EUV) radiation source apparatus includes a collector mirror, a target droplet generator for generating a tin (Sn) droplet, a rotatable debris collection device, one or more coils for generating an inductively coupled plasma (ICP), a gas inlet for providing a source gas for the ICP, and a chamber enclosing at least the collector mirror and the rotatable debris collection device. The gas inlet and the one or more coils are configured such that the ICP is spaced apart from the collector mirror. In one or more of the foregoing and following embodiments, the source gas includes one or more of He, Ar, Xe, $Cl_2$, $H_2$, $O_2$, $SiH_4$, $SiCl_4$ and $SiH_2Cl_2$. In one or more of the foregoing and following embodiments, the source gas is a Cl containing gas. In one or more of the foregoing and following embodiments, the EUV radiation source apparatus further includes a lower cone provided between the rotatable debris collection device and an EUV output port. At least one coil surrounds or covers the lower cone. In one or more of the foregoing and following embodiments, the source gas is provided from a position between the lower cone and the EUV output port. In one or more of the foregoing and following embodiments, at least one coil surrounds or covers the rotatable debris collection device. In one or more of the foregoing and following embodiments, the source gas is provided from a position between the rotatable debris collection device and the collector mirror. In one or more of the foregoing and following embodiments, the EUV radiation source apparatus further includes a lower cone provided between the rotatable debris collection device and an EUV output port. The source gas is exhausted from at least one of a position between the rotatable debris collection device and the lower cone and a position between the lower cone and the EUV output port. In one or more of the foregoing and following embodiments, the EUV radiation source apparatus further includes an AC power source for supplying AC power to the one or more coils. In one or more of the foregoing and following embodiments, two or more coils are provided, and current for each of the two or more coils is independently tunable. In one or more of the foregoing and following embodiments, a phase of the current flowing in one of the two or more coils is different by 180 degrees from a phase of the current flowing in another one of the two or more coils.

In accordance with another aspect of the present disclosure, an extreme ultra violet (EUV) radiation source apparatus includes a collector mirror, a target droplet generator for generating a tin (Sn) droplet, a rotatable debris collection device, one or more coils for generating an inductively coupled plasma (ICP), a gas inlet for providing a source gas for the ICP, and a chamber enclosing at least the collector mirror and the rotatable debris collection device. The source gas includes one or more of a Si containing gas and a Zr containing gas. In one or more of the foregoing and following embodiments, the source gas includes zirconium tetra-tert-butoxide. In one or more of the foregoing and following embodiments, at least one coil surrounds or covers a backside of the collector mirror. In one or more of the foregoing and following embodiments, at least one coil surrounds or covers the rotatable debris collection device. In one or more of the foregoing and following embodiments, the EUV radiation source apparatus further includes a lower cone provided between the rotatable debris collection device and an EUV output port. At least one coil surrounds or covers the lower cone.

In accordance with another aspect of the present disclosure, in a method of cleaning parts in a chamber of an EUV radiation source, a Cl containing gas is supplied into the chamber, and inductively coupled plasma (ICP) is generated by supplying AC power to coils disposed inside the chamber, thereby removing tin debris by forming $SnCl_4$. The ICP is generated such that the ICP does not cause damage to a collector mirror. In one or more of the foregoing and following embodiments, the ICP is generated during a period when an EUV light is not generated. In one or more of the foregoing and following embodiments, current for each of the coils is independently controlled. In one or more of the foregoing and following embodiments, a phase of the current flowing in one of the coils is different by 180 degrees from a phase of the current flowing in another one of the coils.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning parts in a chamber of an extreme ultraviolet (EUV) radiation source, the chamber enclosing a plurality of vanes, a collector mirror, and a lower cone, wherein the plurality of vanes extend between the collector mirror and the lower cone, the method comprising:
generating a plasma, while supplying a Cl containing gas into the chamber from a gas inlet located between the plurality of vanes and the collector mirror, the plasma being generated by providing alternating current (AC) power to first and second inductively coupled plasma (ICP) coils by one or more ICP circuits provided around a chamber boundary where the plurality of vanes are disposed, wherein the plasma is generated in a first region in the chamber at opposite sides of an optical axis, wherein the optical axis extends between a zone of excitation and an output port of the EUV radiation source, and wherein the first region extends along a portion of a length of the chamber next to the plurality of vanes and away from the collector mirror of the EUV radiation source and away from the lower cone; and
performing a removal of tin debris by the plasma generated by the first and second ICP coils and the Cl containing gas,
wherein a gas outlet is provided between the plurality of vanes and the lower cone,
the plurality of vanes are rotating vanes supported by a first end support and a second end support having a smaller diameter than the first end support, and
the Cl containing gas is $SiH_2Cl_2$.

2. The method of claim 1, wherein the plasma is generated during a period of time when an EUV light is not generated by the EUV radiation source.

3. The method of claim 1, wherein a current for each of the first and second ICP coils is independently controlled.

4. The method of claim 3, wherein a phase of the current flowing in one of the coils is different by 180 degrees from a phase of the current flowing in another one of the coils.

5. The method of claim 1, wherein the EUV radiation source further includes a buffer gas inlet for supplying $H_2$, He, Ar, or $N_2$.

6. The method of claim 1, wherein:
the chamber includes an additional gas inlet located at lower cone at a EUV outlet port side, and
the Cl containing gas enters the chamber from the gas inlet and the additional gas inlet.

7. The method of claim 1, wherein the Cl containing gas is supplied with one or more carrier gases selected from the group consisting of Ar, He, Xe and $H_2$ gases.

8. The method of claim 1, wherein the plasma in the first region is essentially symmetrical with respect to the optical axis, and wherein the plasma in the first region is in contact with the plurality of vanes of the EUV radiation source and is not in contact with the collector mirror, and
the method further comprises:
performing the removal of the tin debris attached to the plurality of vanes of the EUV radiation source.

9. The method of claim 1, wherein the first and second ICP coils are disposed around the chamber boundary where the rotating vanes are disposed and the first and second ICP coils are separated along the optical axis.

10. A method of cleaning parts in a chamber of an extreme ultraviolet (EUV) radiation source, the chamber enclosing a plurality of vanes, a collector mirror, and a lower cone, wherein the plurality of vanes extend between the collector mirror and the lower cone, the method comprising:
generating a plasma, while supplying a Cl containing gas and a carrier gas into the chamber from a first gas inlet, the plasma being generated by providing alternating current (AC) power to first and second inductively coupled plasma (ICP) coils by one or more ICP circuits provided around a chamber boundary where the plurality of vanes are disposed to generate ICP in a first region in the chamber at opposite sides of an optical axis, wherein the optical axis extends between a zone of excitation and an output port of the EUV radiation source, and wherein the first region extends along a portion of a length of the chamber next to the plurality of vanes and away from the collector mirror of the EUV radiation source and away from the lower cone; and
performing a removal of tin debris by Cl radicals in the generated plasma,
wherein a gas outlet is provided between the plurality of vanes and the lower cone, and
the Cl containing gas is $CCl_4$.

11. The method of claim 10, wherein the plasma is generated during a period of time when an EUV light is not generated by the EUV radiation source.

12. The method of claim 10, wherein a current for each of the first and second ICP coils is independently controlled.

13. The method of claim 10, further comprising switching supplying of the Cl containing gas to supplying of a Zr containing gas.

14. The method of claim 10, wherein:
the chamber includes a second gas inlet located at lower cone at a EUV outlet port side, and
the Cl containing gas enters the chamber from the first gas inlet and the second gas inlet.

15. The method of claim 10, wherein the carrier gas includes one or more gases selected from the group consisting of Ar, He, Xe and $H_2$ gases.

* * * * *